(12) United States Patent
Hasegawa et al.

(10) Patent No.: US 7,629,656 B2
(45) Date of Patent: Dec. 8, 2009

(54) SEMICONDUCTOR DEVICE GUARD RING

(75) Inventors: Mieko Hasegawa, Kanagawa (JP);
Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/485,438

(22) Filed: Jul. 13, 2006

(65) Prior Publication Data
US 2007/0018326 A1    Jan. 25, 2007

(30) Foreign Application Priority Data
Jul. 21, 2005    (JP) .............................. 2005-211478

(51) Int. Cl.
*H01L 27/088*    (2006.01)
(52) U.S. Cl. ................. 257/409; 257/E23.178
(58) Field of Classification Search .................. 257/409, 257/E23.178
See application file for complete search history.

(56) References Cited

U.S. PATENT DOCUMENTS

| | | | | |
|---|---|---|---|---|
| 6,525,398 | B1* | 2/2003 | Kim et al. ................... | 257/529 |
| 2002/0125577 | A1* | 9/2002 | Komada ....................... | 257/774 |
| 2004/0042285 | A1* | 3/2004 | Yoshizawa et al. .......... | 365/200 |
| 2005/0146014 | A1 | 7/2005 | Gutierrez | |

FOREIGN PATENT DOCUMENTS

| | | |
|---|---|---|
| CN | 1388582 | 1/2003 |
| CN | 1519924 | 8/2004 |
| JP | 2004-297022 | 10/2004 |
| JP | 2004-311930 | 11/2004 |

OTHER PUBLICATIONS

English translation of Chinese Official Action issued Feb. 29, 2008 in corresponding Chinese Appln No. 200610105753.4.

* cited by examiner

*Primary Examiner*—Bradley K Smith
*Assistant Examiner*—Amar Movva
(74) *Attorney, Agent, or Firm*—Young & Thompson

(57) ABSTRACT

A semiconductor device 1 includes a semiconductor substrate 10, insulating interlayer group 20 (first insulating interlayer group), insulating interlayer group 30 (second insulating interlayer group), and seal ring 40 (guard ring). The insulating interlayer group 20 is formed on the semiconductor substrate 10. The insulating interlayer group 30 is formed on the insulating interlayer group 20. The insulating interlayer group 30 is formed by an insulating material having a lower dielectric constant than that of the insulating interlayer group 20. The seal ring 40 is provided so as to surround the circuit forming regions D11 and D12. The seal ring 40 penetrates through the interface between the insulating interlayer group 20 and the insulating interlayer group 30 and is provided apart from the semiconductor substrate 10.

25 Claims, 5 Drawing Sheets

SEMICONDUCTOR DEVICE GUARD RING

This application is based on Japanese Patent application NO. 2005-211478, the content of which is incorporated hereinto by reference.

BACKGROUND

1. Technical Field

The present invention relates to a semiconductor device.

2. Related Art

As for a conventional semiconductor device, there is one that is disclosed in, for instance, Japanese Laid-open patent publications No. 2004-297022 and No. 2004-311930. In such a semiconductor device, a seal ring that surrounds a circuit forming region is provided in order to prevent moisture or ions from entering the circuit forming region from outside. The seal ring is generally formed by interconnect, a via plug and the like which are the same as a circuit forming region.

However, according to knowledge of the present inventors, in a conventional semiconductor device, there is a case where noise generated in a certain circuit forming region is transmitted to another circuit forming region via the seal ring. In this case, the seal ring becomes a noise transmission path.

SUMMARY OF THE INVENTION

The present invention provides an improved structure of a seal ring.

According to the present invention, there is provided a semiconductor device having a circuit forming region, including: a semiconductor substrate, a first insulating interlayer group provided on the semiconductor substrate and formed by a first insulating material, a second insulating interlayer group provided on the first insulating interlayer group and formed by a second insulating material whose dielectric constant is lower than that of the first insulating material, and a guard ring which surrounds the circuit forming region. The guard ring penetrates through an interface between the first insulating interlayer group and the second insulating interlayer group, and is provided apart from the semiconductor substrate.

In addition, the first insulating interlayer group is one insulating interlayer formed by the first insulating material or a plurality of insulating interlayers formed by a first insulating material and continuously provided. The second insulating interlayer group is also the same. In addition, continuing the insulating interlayer is that the insulating interlayers do not need to come in contact with each other, but another layer such as an etching stopper layer may interpose therebetween. That is, when only the insulating interlayers are focused, it can be said that the insulating interlayers continue if they are adjacent to each other.

In this semiconductor device, the guard ring is provided apart from the semiconductor substrate, thereby preventing the guard ring from being a noise transmission path. Further, the guard ring penetrates through the interface between the first and second insulating interlayer groups formed by different insulating materials. Thereby, even when moisture or the like from outside enters the interface, a path reaching the circuit forming region can be cut off by the guard ring.

According to the present invention, there is actualized a semiconductor device, which is capable of effectively preventing noise from being transmitted via a guard ring and moisture or the like from entering a circuit forming region.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A preferred embodiment of a semiconductor device according to the present invention will be described below in detail with reference to the drawings. In addition, in the description of the drawings, the same elements are designated by the same numerals and their description will not be repeated.

Figure 1:
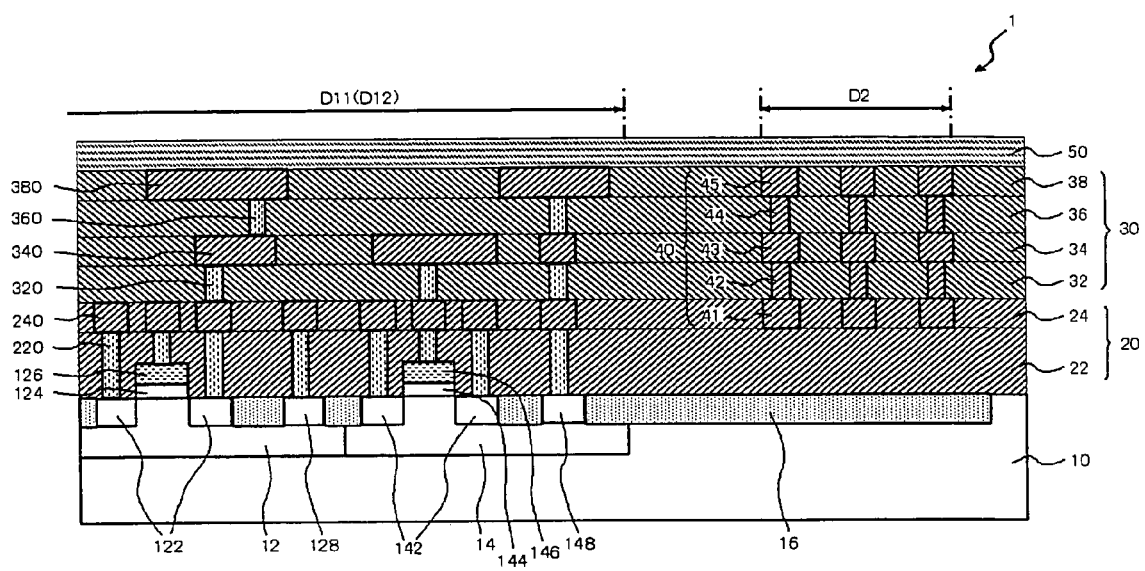
FIG. 1 is a cross-sectional view showing a first embodiment of a semiconductor device according to the present invention.
Figure 2:
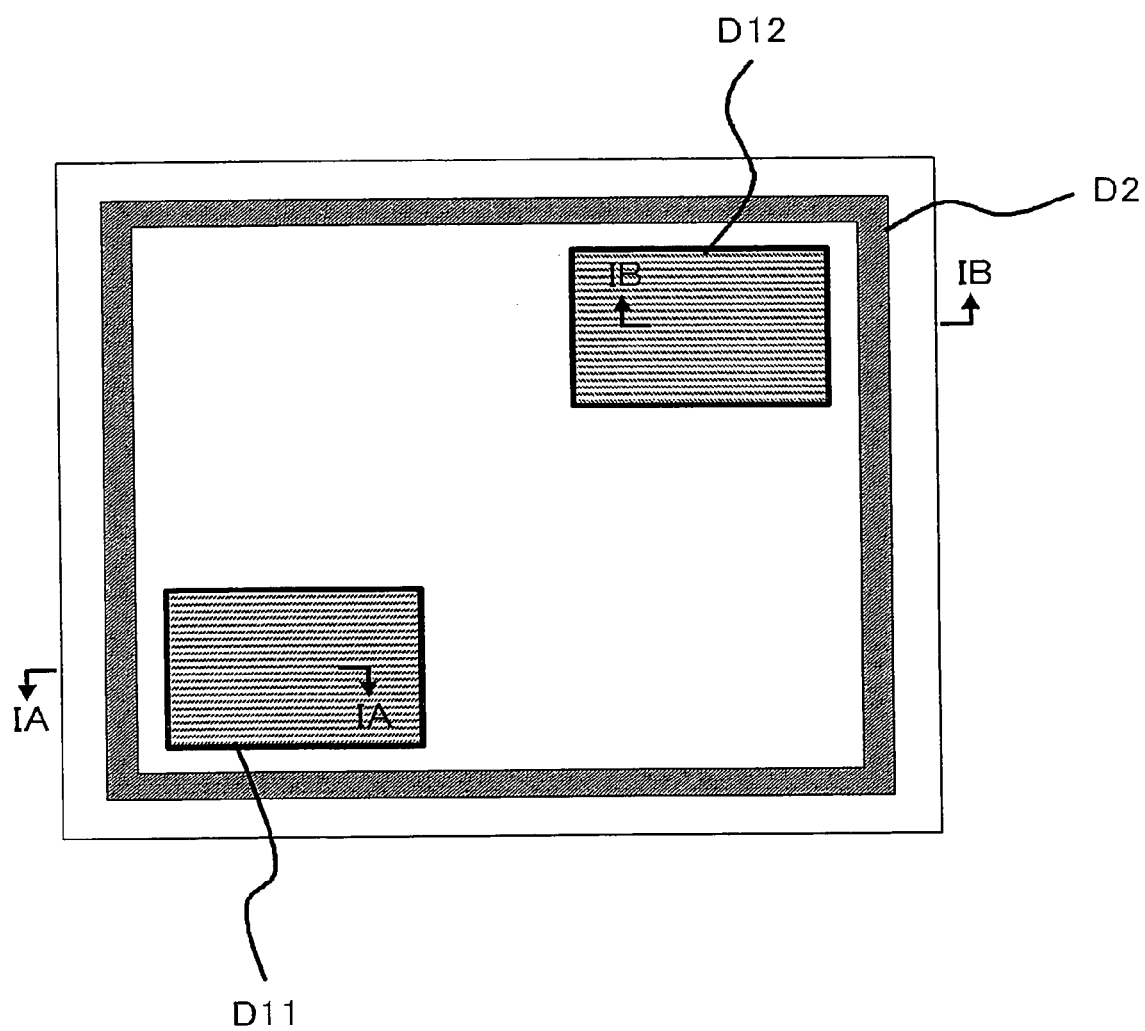
FIG. 2 is a plan view showing the semiconductor device of FIG. 1.

FIG. 1 is a cross-sectional view showing a first embodiment of a semiconductor device according to the present invention. FIG. 2 is a plan view showing the semiconductor device of FIG. 1. FIG. 1 is a cross-sectional view taken along the line IA-IA or IB-IB shown in FIG. 2. A semiconductor device 1 includes a semiconductor substrate 10, an insulating interlayer group 20 (a first insulating interlayer group) an insulating interlayer group 30 (a second insulating interlayer group), and a seal ring 40 (guard ring). Furthermore, the semiconductor device 1 includes two circuit forming regions D11 and D12, and a seal ring region D2 surrounding the circuit forming regions D11 and D12. The circuit forming region D11 is, for example, a logic section constituted as a digital circuit. On the other hand, the circuit forming region D12 is, for example, an analog section constituted as an analog circuit.

The semiconductor substrate 10 is, for example, a P type silicon substrate. An N type well region 12, a P type well region 14, and an element isolation region 16 are formed in the semiconductor substrate 10. Further, a P+ type diffusion layer 122 functioning as a source and drain region and an N+ type diffusion layer 128 functioning as a contact layer of the N type well region 12 are formed in the N type well region 12. A gate electrode 126 is formed on the N type well region 12 of the semiconductor substrate 10 via a gate oxide film 124. The diffusion layer 122, the gate oxide film 124, and the gate electrode 126 constitute a P type MOSFET.

Furthermore, an N+ type diffusion layer 142 functioning as a source and drain region and a P+ type diffusion layer 148 functioning as a contact layer of the P type well region 14 are formed in the P type well region 14. A gate electrode 146 is formed on the P type well region 14 of the semiconductor substrate 10 via a gate oxide film 144. The diffusion layer 142, the gate oxide film 144, and the gate electrode 146 constitute an N type MOSFET.

A contact plug 220 is connected to the diffusion layer 122, the gate electrode 126, the diffusion layer 128, the diffusion layer 142, the gate electrode 146, and the diffusion layer 148, respectively. An interconnect 240 (a first interconnect) is connected to the contact plug 220. The interconnect 240 is the lowermost layer interconnect in a multilayer interconnect.

The insulating interlayer group 20 is provided on the semiconductor substrate 10. The insulating interlayer group 20 includes an insulating interlayer 22 (a contact insulating interlayer) and an insulating interlayer 24 (a first interconnect insulating interlayer). The insulating interlayer 22 is provided on the semiconductor substrate 10. The above-mentioned contact plugs 220 are embedded in the insulating interlayer 22. Another insulating interlayer 24 is provided on the insulating interlayer 22. The above-mentioned interconnects 240 are embedded in the insulating interlayer 24.

The insulating interlayer group 30 is provided on the insulating interlayer group 20. The insulating interlayer group 30 includes an insulating interlayer 32 (a first via insulating interlayer), an insulating interlayer 34 (a second interconnect insulating interlayer), an insulating interlayer 36 (a second via insulating interlayer), and an insulating interlayer 38 (a third interconnect insulating interlayer). The insulating interlayer 32 is provided on the insulating interlayer 24. A via plug 320 (a first via plug) connected to the interconnect 240 is embedded in the insulating interlayer 32. The insulating interlayer 34 is provided on the insulating interlayer 32. An interconnect 340 (a second interconnect) connected to the via plug 320 is embedded in the insulating interlayer 34. The insulating interlayer 36 is provided on the insulating interlayer 34. A via plug 360 (a second via plug) connected to the interconnect 340 is embedded in the insulating interlayer 36. The insulating interlayer 38 is provided on the insulating interlayer 36. An interconnect 380 (a third interconnect) connected to the via plug 360 is embedded in the insulating interlayer 38. In addition, for example, copper or aluminum may be included as a material of the above-mentioned contact plug 220, the interconnects 240, 340, and 380, and the via plugs 320 and 360.

The insulating interlayer group 30 is formed by an insulating material having a lower dielectric constant than that of the insulating interlayer group 20. A relative dielectric constant of the insulating material (the first insulating material) constituting the insulating interlayer group 20 is, for example, not less than 4.0. Meanwhile, for example, a relative dielectric constant of the insulating material (the second insulating material) constituting the insulating interlayer group 30 is, for example, not more than 3.5. Furthermore, for example, silicon oxide may be included as the first insulating material. Meanwhile, for example, a low dielectric constant material may be included as the second insulating material.

As a low dielectric constant material, for example, polyorganosiloxane such as carbon-incorporated silicon oxide (referred to as SiOC), hydrogen silsesquioxane (referred to as HSQ), methyl silsesquioxane (referred to as MSQ), or methyl hydrogen silsesquioxane (referred to as MHSQ), organic material containing aromatic series such as polyallyl ether (referred to as PAE), divinylsiloxane-bis-benzocyclobutene (BCB), or Silk (registered trademark), spin on glass (referred to as SOG) flowable oxide (referred to as FOX), and the like may be used. Furthermore, porous like material may be used as a low dielectric constant material. Thereby, a relative dielectric constant of the film can be further lowered.

The seal ring 40 is provided so as to surround the circuit forming regions D11 and D12. The seal ring 40 penetrates through the interface between the insulating interlayer group 20 and the insulating interlayer group 30. More specifically, the seal ring 40 has its inception at an interface between the insulating interlayer 38 and a passivation film 50 to be described later and extends to an interface between the insulating interlayer 22 and the insulating interlayer 24. In other words, one end of the seal ring 40 (an end of the semiconductor substrate 10 side) stops at the interface between the insulating interlayer 22 and the insulating interlayer 24. When seen with respect to the height direction of the semiconductor device 1 (a direction perpendicular to the substrate surface of the semiconductor substrate 10), the seal ring 40 extends over the entire of the insulating interlayer group 30, whereas the seal ring 40 extends at only a part of the insulating interlayer group 20 (the insulating interlayer 24 in this embodiment). Furthermore, the seal ring 40 is provided apart from the semiconductor substrate 10. In this embodiment, particularly, the entire of the seal ring 40 is apart from the semiconductor substrate 10.

The seal ring 40 is composed of conductive members 41 to 45. The conductive member 41 is embedded in the insulating interlayer 24 and formed by the same material as that of the interconnect 240. The conductive member 42 is embedded in the insulating interlayer 32 and formed by the same material as that of the via plug 320. The conductive member 43 is embedded in the insulating interlayer 34 and formed by the same material as that of the interconnect 340. The conductive member 44 is embedded in the insulating interlayer 36 and formed by the same material as that of the via plug 360. The conductive member 45 is embedded in the insulating interlayer 38 and formed by the same material as that of the interconnect 380. It is possible to form each of the conductive members 41 to 45 concurrently with the interconnect 240, the via plug 320, the interconnect 340, the via plug 360, and the interconnect 380.

In this embodiment, the seal ring 40 includes a plural number (specifically, three). That is, the circuit forming regions D11 and D12 are surrounded by the seal ring 40 being triplicated.

The upper surface of the insulating interlayer group 30 is covered with the passivation film 50. The passivation film 50 is a protective film which protects the surface of the semiconductor device 1. For example, silicon nitride may be included as a material of the passivation film 50.

Subsequently, effect of the semiconductor device 1 will be described. In the semiconductor device 1, the seal ring 40 is formed apart from the semiconductor substrate 10, thereby preventing the seal ring 40 from being a noise transmission path.

Figure 3:
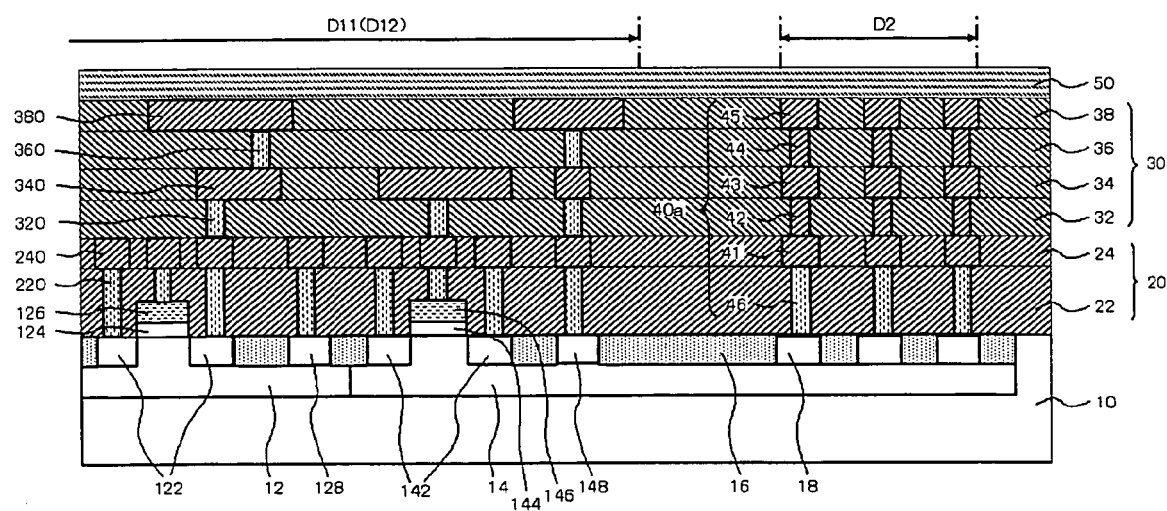
FIG. 3 is a cross-sectional view of a semiconductor device according to a comparative example.

In this regard, a semiconductor device according to a comparative example of the semiconductor device 1 will be shown in FIG. 3. In the semiconductor device of the same drawing, a seal ring 40a is constituted by above-mentioned conductive members 41 to 45 and a conductive member 46. The conductive member 46 is embedded in an insulating interlayer 22 and formed by the same material as that of the contact plug 220. Furthermore, a P type well region 14 extends to a seal ring region D2 and a P+ type diffusion layer 18 is formed in the P type well region 14 within the seal ring region D2. The conductive member 46 is connected to the diffusion layer 18.

Figure 4:
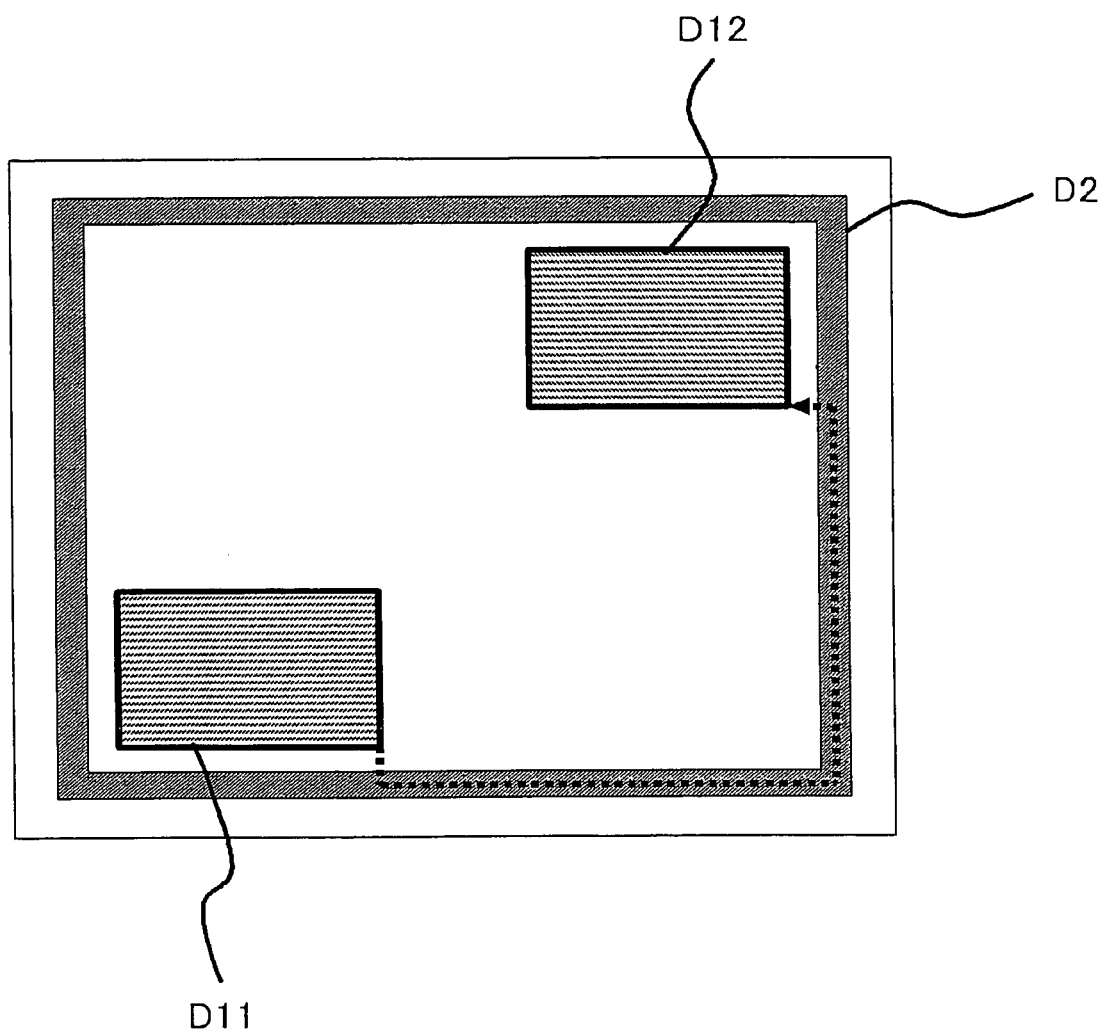
FIG. 4 is a plan view for explaining a problem of the semiconductor device of FIG. 3.

In such a configured semiconductor device, as shown in FIG. 4, noise generated at one of a circuit forming region D11 or a circuit forming region D12 is transmitted to the other via the seal ring 40a. A noise transmission path is shown by a dot line arrow in the same drawing. This is because the seal ring 40a and a semiconductor substrate 10 are electrically connected and therefore the seal ring 40a functions as the noise transmission path.

While on the other hand, according to the semiconductor device 1, the seal ring 40 is apart from the semiconductor substrate 10, whereby a noise transmission path via the seal ring 40 can be cut off. Particularly, in the case where the circuit forming region D11 and the circuit forming region D12 are respectively constituted as a digital circuit and an analog circuit, noise generated at the former may cause false operation at the latter. Consequently, in this case, the semiconductor device 1 is especially useful.

Further, the seal ring 40 penetrates through the interface between the insulating interlayer groups 20 and 30 formed by different insulating materials. Thereby, even when moisture or the like from outside enters from this interface, paths in which such moisture or the like reach the circuit forming regions D11 and D12 can be cut off by the seal ring 40. As described above, the semiconductor device 1 capable of effectively preventing noise from transmitting via the seal ring 40 and moisture or the like from entering the circuit forming regions D11 and D12, is actualized.

Furthermore, the seal ring 40 also functions to suppress crack generation in the circuit forming regions D11 and D12 when dicing a dicing region in the manufacturing step of the semiconductor device 1. That is, crack generation occurs in the dicing region when dicing; however, the seal rings 40 exist between the dicing region and the circuit forming regions D11 and D12. Therefore, the crack reaching the circuit forming regions D11 and D12 can be prevented.

The seal ring 40 extends over the entire length of the insulating interlayer group 30 with respect to the height direction of the semiconductor device 1, thereby effectively preventing moisture or the like from entering the circuit forming regions D11 and D12 from the side of the insulating interlayer group 30. In the case where a low dielectric constant material is used in the insulating interlayer group 30, the low dielectric constant material has property to absorb moisture easily and therefore it is especially essential to prevent moisture or the like from entering from the insulating interlayer group 30.

The entire of the seal ring 40 is provided apart from the semiconductor substrate 10. Thereby, height of the entire of the bottom surface of the seal ring 40 from the semiconductor substrate 10 can be uniformed, and therefore, manufacturing of the seal ring 40, eventually, manufacturing of the semiconductor device 1 can be facilitated. In addition, the entire of the seal ring 40 being apart from the semiconductor substrate 10, is not essential; a part of the seal ring 40 may reach the semiconductor substrate 10. However, even in such a case, in order to prevent the seal ring 40 from being a noise transmission path connecting the circuit forming region D11 and the circuit forming region D12, it is configured so that the seal ring 40 comes in contact with the semiconductor substrate 10 of only one of the circuit forming region D11 and the circuit forming region D12.

One end of the seal ring 40 stops at the interface between the insulating interlayer 22 and the insulating interlayer 24. As described above, the seal ring 40 is formed using the interconnects and the via plugs not lower than the first interconnect layer (the insulating interlayer 24), whereby configuration in which the seal ring 40 penetrates through the interface between the insulating interlayer group 20 and the insulating interlayer group 30 and is apart from the semiconductor substrate 10, can be easily actualized.

The insulating interlayers not higher than the insulating interlayer 24 (the insulating interlayers 22 and 24) are formed by the first insulating material having a relatively high dielectric constant, whereas the insulating interlayer not lower than the insulating interlayer 32 (the insulating interlayers 32, 34, 36, and 38) are formed by the second insulating material having a relatively low dielectric constant. Thereby, parasitic capacitance in the insulating interlayer not lower than the insulating interlayer 32 for use in relatively middle or long distance interconnect, can be suppressed small.

The semiconductor device according to the present invention is not limited to the above-mentioned embodiments, however various modifications can be made. For example, the above-mentioned embodiments exemplify that the interface between the insulating interlayer group 20 and the insulating interlayer group 30 is placed between the insulating interlayer 24 and the insulating interlayer 32, however, the interface may be placed between other continuing two insulating interlayers. For example, the above-mentioned interface may be placed between the insulating interlayer 32 and the insulating interlayer 34, alternatively placed between the insulating interlayer 22 and the insulating interlayer 24.

Figure 5:
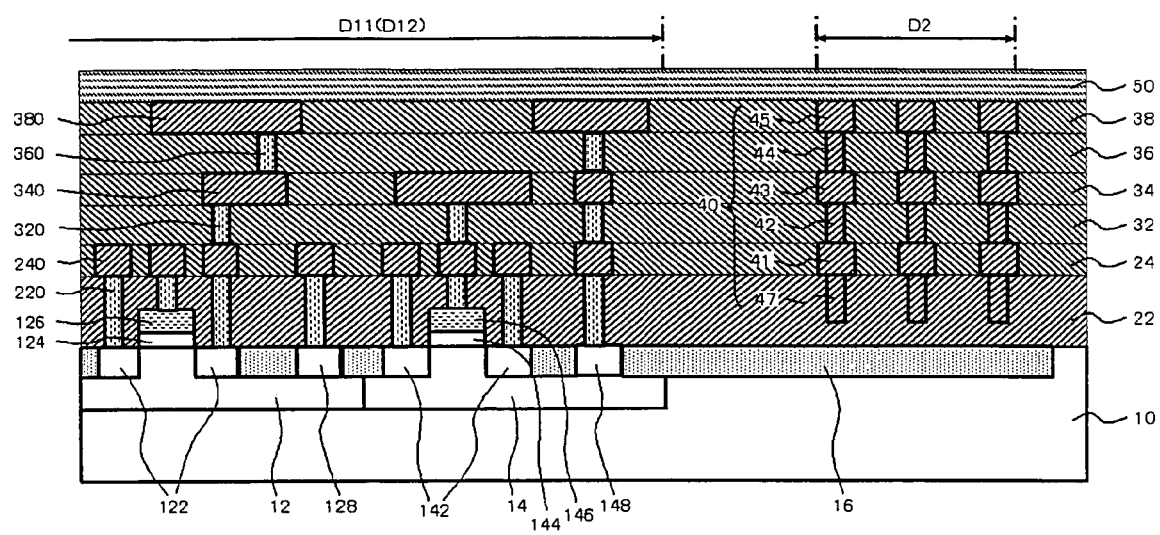
FIG. 5 is across-sectional view showing a semiconductor device according to a modification example.

In addition, in the latter case, the lower end of the seal ring 40 stops at a mid-height of the insulating interlayer 22, as shown in FIG. 5. In the same drawing, the seal ring 40 includes a conductive member 47 in addition to conductive members 41 to 45. The conductive member 47 is embedded in apart of the insulating interlayer 22 in the height direction of the semiconductor device 1. By such a configuration, configuration in which the seal ring 40 penetrates the interface between the insulating interlayer group 20 and the insulating interlayer group 30 and is apart from the semiconductor substrate 10, is actualized.

Furthermore, the above-mentioned embodiments exemplify a plurality of the circuit forming regions (the circuit forming regions D11 and D12) are provided in a region surrounded by the seal ring 40, however, the number of the circuit forming region provided in the region surrounded by the seal ring 40 may be one.

It is apparent that the present invention is not limited to the above embodiment, and may be modified and changed without departing from the scope and spirit of the invention.

What is claimed is:

1. A semiconductor device having a circuit forming region, comprising:
    a semiconductor substrate, said semiconductor substrate including a first circuit forming region and a second circuit forming region;
    a first insulating interlayer group provided on said semiconductor substrate and constituted of a first insulating material;
    a second insulating interlayer group provided on said first insulating interlayer group and constituted of a second insulating material having a dielectric constant lower than that of said first insulating material; and
    a guard ring which surrounds said circuit forming region, wherein,
    said first insulating interlayer group includes:
    i) a contact insulating interlayer which is provided on said semiconductor substrate,
    ii) a contact plug embedded in said contact insulating interlayer,
    iii) a gate electrode embedded in said contact insulating interlayer,
    iv) a first interconnect insulating interlayer provided on said contact insulating interlayer, and
    v) a first interconnect embedded in said first interconnect insulating interlayer, said first interconnect and said gate electrode being different, with a bottommost surface of said first interconnect being above a topmost surface of said gate electrode, the bottommost surface of said first interconnect and a bottommost surface of said guard ring are substantially coplanar, the bottommost surface of said first interconnect is planar, a top surface of said first interconnect is planar, a bottommost surface of said contact plug is planar, a top surface of said contact plug is planar, said guard ring penetrates through an interface between said first insulating interlayer group and said second insulating interlayer group, and said guard ring is separated from said semiconductor substrate to prevent noise from being transmitted between the first circuit forming region and the second circuit forming region, said guard ring being free of an electrical connector between the guard ring and the semiconductor substrate at the first circuit forming region.

2. The semiconductor device according to claim 1, wherein said guard ring has one end which stops at an interface between said contact insulating interlayer and said first interconnect insulating interlayer.

3. The semiconductor device according to claim 2, wherein said second insulating interlayer group includes a via insulating interlayer which is provided on said first interconnect insulating interlayer and in which a via plug is embedded.

4. The semiconductor device according to claim 1, wherein said first insulating material is silicon oxide, and wherein said second insulating material is a low dielectric constant material.

5. The semiconductor device according to claim 1, wherein an entirety of the guard ring is free of any electrical connector between the guard ring and the semiconductor substrate.

6. The semiconductor device according to claim 1, wherein said first circuit forming region is a digital circuit, and wherein said second circuit forming region is an analog circuit.

7. The semiconductor device according to claim 1, wherein said first circuit forming region generates said noise and said second circuit forming region is affected by said noise.

8. A semiconductor device having a circuit forming region, comprising:

a semiconductor substrate, said semiconductor substrate including a first circuit forming region and a second circuit forming region;

a first insulating interlayer provided on said semiconductor substrate, and in which a contact plug connected to one of a diffusion layer and a gate electrode is embedded;

a second insulating interlayer provided on said first insulating interlayer, and in which a first interconnect connected to said contact plug is embedded;

a third insulating interlayer provided on said second insulating interlayer, in which a via plug connected to said first interconnect is embedded; and a guard ring which surrounds said circuit forming region, wherein, said guard ring penetrates through said second insulating interlayer and said third insulating interlayer so as to reach at least an interface between said first insulating interlayer and said second insulating interlayer, a bottommost surface of said first interconnect is above a topmost surface of said gate electrode, a bottom surface of said first interconnect and a bottom surface of said guard ring are substantially coplanar, the bottom surface of said first interconnect is planar, a top surface of said first interconnect is planar, a bottom surface of said contact plug is planar, a top surface of said contact plug is planar, and said guard ring is separated from said semiconductor substrate to prevent noise from being transmitted between the first circuit forming region and the second circuit forming region, said guard ring being free of an electrical connector between the guard ring and the semiconductor substrate at the first circuit forming region.

9. A semiconductor device, comprising:

a semiconductor substrate, said semiconductor substrate including a first circuit forming region and a second circuit forming region;

a first insulating interlayer provided on said semiconductor substrate and constituted of a first insulating material having a first dielectric constant, said first insulating interlayer including a first interconnect connecting between elements included in said semiconductor device;

a second insulating interlayer provided on said first insulating interlayer and constituted of a second insulating material having a second dielectric constant, said second dielectric constant being lower than said first dielectric constant, said second insulating interlayer including a second interconnect; and a guard ring including a first conductive member provided in a first layer in which said first interconnect is provided, a second conductive member provided in a second layer in which said second interconnect is provided, and a third conductive member provided in a third layer in which a via plug connecting said first interconnect to said second interconnect is provided, said guard ring surrounding the first circuit forming region and the second circuit forming region, wherein said guard ring is is free of any electrical connector between the guard ring and the semiconductor substrate at the first circuit forming region to prevent noise from being transmitted between the first circuit forming region and the second circuit forming region, wherein a dielectric constant of said third layer, in which said via plug is provided, is lower than said first dielectric constant, wherein the bottom surface and a top surface of said first interconnect are planar, and wherein a bottommost layer of said guard ring is a first conductive material.

10. The semiconductor device according to claim 9, wherein said first conductive member is formed with same material as said first interconnect, and said second conductive member is formed with same material as said second interconnect and said third conductive member is formed with same material as said via plug.

11. The semiconductor device according to claim 9, wherein said first insulating interlayer includes:

a contact insulating interlayer which is provided on said semiconductor substrate and in which a contact plug is embedded; and a first interconnect insulating interlayer which is provided on said contact insulating interlayer and in which said first interconnect is embedded, and wherein said guard ring has one end which stops at an interface between said contact insulating interlayer and said first interconnect insulating interlayer.

12. The semiconductor device according to claim 9, wherein said first insulating material is silicon dioxide, and wherein said second insulating material is a low dielectric constant material.

13. The semiconductor device according to claim 9, wherein an entirety of the guard ring is free of any electrical connector between the guard ring and the semiconductor substrate.

14. The semiconductor device according to claim 1, further comprising:
an element isolation region in said semiconductor substrate, wherein,
a first side of said first insulating interlayer group is in contact with a portion of said element isolation region,
the second insulating interlayer group is provided on a second side of said first insulating interlayer group, and
said portion of said element isolation region is directly beneath all of said guard ring and directly between all of said guard ring and said semiconductor substrate.

15. The semiconductor device according to claim 8, wherein,
the first insulating interlayer provided on said semiconductor substrate is constituted of a first insulating material having a first dielectric constant,
the second insulating interlayer provided on said first insulating interlayer is constituted of a second insulating material having a second dielectric constant,
the first interconnect is embedded in said second insulating interlayer and connects to said contact plug,
the third insulating interlayer provided on said second insulating interlayer is constituted of a third insulating material having a third dielectric constant, and
said third dielectric constant being less than said first dielectric constant and less than said second dielectric constant.

16. The semiconductor device according to claim 1, wherein,
said first insulating interlayer group comprises a first plurality of insulating interlayers each formed by said first insulating material with a relative dielectric constant of said first insulating material is not less than 4.0, and
said second insulating interlayer group comprises a second plurality of insulating interlayers each formed by said second insulating material with a relative dielectric constant of said second insulating material is not more than 3.5.

17. The semiconductor device according to claim 1, wherein said first insulating material is silicon oxide,
said first insulating interlayer group comprises a first plurality of insulating interlayers each formed by said first insulating material of silicon oxide, and
said second insulating interlayer group comprises a second plurality of insulating interlayers each formed by said second insulating material with a relative dielectric constant less than the dielectric constant of said first insulating material of silicon oxide,
said guard ring comprises a vertical series of directly connected vertical portions of conducting material extending through plural layers of said first insulating interlayer group and plural layers of said second insulating group, and
each vertical portion has a width different from a width of an adjacent vertical portion.

18. The semiconductor device according to claim 1, wherein a bottommost surface of said first interconnect is above a topmost surface of said contact plug and is in vertical alignment with said contact plug.

19. The semiconductor device according to claim 8, wherein a bottommost surface of said first interconnect is above a topmost surface of said contact plug and is in vertical alignment with said contact plug.

20. The semiconductor device according to claim 18, wherein,
the first interconnect consists of a first material,
the contact plug consists of a second material different from said first material,
and the gate electrode consists of a third material different from said first and second material.

21. The semiconductor device according to claim 19, wherein,
the first interconnect consists of a first material,
the contact plug consists of a second material different from said first material,
and the gate electrode consists of a third material different from said first and second material.

22. The semiconductor device according to claim 18, further comprising:
another contact plug, wherein,
a topmost surface of said gate electrode is beneath a bottommost surface of said contact plug, and
said gate electrode and said another contact plug are in vertical alignment.

23. The semiconductor device having of claim 1, wherein said first insulating interlayer group includes
a plurality of said contact plug embedded in said contact insulating interlayer,
a plurality of said gate electrode embedded in said contact insulating interlayer, and
a plurality of said first interconnect embedded in said first interconnect insulating interlayer, and
with the bottommost surface of all said first interconnects are above a topmost surface of said gate electrodes,
the bottommost surface of all said first interconnects and the bottommost surface of said guard ring being substantially coplanar,
the bottommost surface of all said first interconnects are coplanar with each other,
the top surface of all said first interconnects are coplanar with each other,
the bottom surface of all said contact plugs are respectively coplanar with each other, and
the top surface of all said contact plugs are respectively coplanar with each other.

24. The semiconductor device according to claim 8, further comprising:
an element isolation region in said semiconductor substrate, and wherein,
all of said contact plug, said first interconnect, and said via plug are within one of said first and said second circuit forming regions,
a lower-most surface of said guard ring is spaced apart from an upper-most surface of said semiconductor substrate, and
said first insulating interlayer and said element isolation region being directly beneath all of said lower-most surface of said guard ring and directly between all of said guard ring and said semiconductor substrate.

25. The semiconductor device according to claim 9, further comprising:
another guard ring, said another guard ring surrounding the guard ring and both first and second circuit forming regions.

* * * * *